United States Patent
Noguchi et al.

[19]

[11] Patent Number: 6,080,643

[45] Date of Patent: *Jun. 27, 2000

[54] ELIMINATION OF DEHYDROGENATION STEP WHEN FORMING A SILICON THIN FILM DEVICE BY LOW-TEMPERATURE LASER-ANNEALING

[75] Inventors: Takashi Noguchi, Kanagawa; Hajime Yagi, Tokyo; Yasuhiro Kanaya, Kanagawa, all of Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/021,826

[22] Filed: Feb. 11, 1998

[30] Foreign Application Priority Data

Feb. 14, 1997 [JP] Japan .................................... 9-047115

[51] Int. Cl.$^7$ .................................................. H01L 21/36
[52] U.S. Cl. ......................... 438/487; 438/149; 438/151; 438/166; 438/486
[58] Field of Search .............................. 438/30, 142, 149, 438/151, 166, 478, 479, 482, 486, 487, 308

[56] References Cited

U.S. PATENT DOCUMENTS 5,453,858  9/1995  Yamazaki .
5,559,042  9/1996  Yamazaki et al. .
5,567,967  10/1996  Kusumoto .

FOREIGN PATENT DOCUMENTS 401168063  7/1989  Japan .

OTHER PUBLICATIONS

S. M. Sze, VLSI Technology, second edition, p 386–391, 1988.
S. M> Sze, VLSI Technology, second edition,pp. 386–387, 1988.
Stanely Wolf, Silicon Processing for the VLSI Era, vol. 1: Process Technology, p. 367, 1986.
S. L. Rohde, Sputter Deposition, ASM Handbook, vol. 5 Surface Engineering, p. 573, 1994.

*Primary Examiner*—Charles Bowers
*Assistant Examiner*—Evan Pert
*Attorney, Agent, or Firm*—Hill & Simpson

[57] ABSTRACT

Disclosed is a process of forming a silicon thin film used as an active layer of a thin film transistor, which process is improved for enhancing a quality and a productivity of the silicon thin film. At a physical vapor deposition step, an amorphous silicon thin film is physically formed on a substrate in vacuum. Then, at a laser annealing step, directly after formation of the amorphous silicon thin film without the need of dehydrogenation, a laser light is irradiated to the amorphous silicon thin film, to convert the amorphous silicon thin film into a polycrystalline silicon thin film. After that, the polycrystalline silicon thin film thus converted is processed to form a thin film transistor. In the physical vapor deposition step, an amorphous silicon thin film may be formed by sputtering using a target made from a silicon crystal body or a silicon sintered body. In the sputtering, an amorphous silicon thin film can be formed by sputtering using a target previously mixed with an impurity in a desired concentration. By introducing an impurity in the amorphous silicon thin film at the film formation stage, a threshold characteristic of a thin film transistor can be previously controlled.

6 Claims, 8 Drawing Sheets

ELIMINATION OF DEHYDROGENATION STEP WHEN FORMING A SILICON THIN FILM DEVICE BY LOW-TEMPERATURE LASER-ANNEALING

BACKGROUND OF THE INVENTION

The present invention relates to a method of fabricating a thin film semiconductor device in which thin film transistors each having an active layer made from polycrystalline silicon are integrally formed on a substrate, and more particularly to a technology for fabricating a polycrystalline silicon thin film transistor by a low temperature process.

A thin film semiconductor device, which is typically suitable as a drive substrate for a display such as an active matrix type liquid crystal display, is being extensively developed at present. An active layer of a thin film transistor is made from polycrystalline silicon or amorphous silicon. In particular, attention has been focused on a technology regarding a polycrystalline silicon thin film transistor capable of realizing a high precision active matrix type color liquid crystal display with a small-sized structure. To be more specific, in this technology, a polycrystalline silicon thin film, which has been used only as an electrode material or a resistance material in the related art semiconductor technology, is utilized for an active layer of each of thin film transistors used as pixel switching elements formed on an insulating substrate made from transparent glass or the like. The technology using a polycrystalline silicon thin film transistor seems to be the only one means capable of realizing thin film transistors used for high performance switching elements enabling a high density design for ensuring such an image quality as to meet the needs of the market. Such a technology simultaneously allows a peripheral circuit section having been composed of external ICs to be formed on the same substrate together with a pixel array section by the same process. The technology using a polycrystalline silicon thin film is thus allowed to realize a high precision active matrix liquid crystal display of a type integrated with a peripheral circuit section which has been never allowed to be realized by the technology using an amorphous silicon thin film transistor.

Since polycrystalline silicon exhibits a carrier mobility larger than that of amorphous silicon, a current drive ability of a polycrystalline silicon thin film transistor becomes higher. As a result, a peripheral circuit section requiring high speed driving such as a horizontal scanning circuit and a vertical scanning circuit can be formed on the same substrate simultaneously with thin film transistors as pixel switching elements. This makes it possible to significantly reduce the number of signal lines taken out of a thin film semiconductor device as a display. Further, a CMOS circuit in which N-channel type and P-channel type thin film transistors are integrally formed can be of configured as an on-chip structure. This enables integration of a level shift circuit, thus realizing low voltage driving of a timing signal.

As a device technology and a process technology regarding a thin film transistor, there has been already established a high temperature process technology adopting a processing temperature of 900° C. or more. A feature of the high temperature process lies in reforming a semiconductor thin film formed on a high heat-resisting substrate made from quartz or the like by a solid-phase growth process. In the solid-phase growth process, a semiconductor thin film is processed by heat-treatment at a temperature of 600° C. or more. At this heat-treatment, individual crystal grains contained in a polycrystalline silicon body composed of an aggregation of fine silicon crystals at the film formation stage becomes larger. A polycrystalline silicon film obtained by the solid-phase growth process and high-temperature heat treatment thereafter exhibits a high carrier mobility of about 100 $cm^2/vxs$. To carry out the above high temperature process, it is essential to adopt a high heat-resistant. As such a substrate, there has been used an expensive material such as quartz. It is apparent that quartz is disadvantageous in terms of reduction in fabrication cost.

In place of the above-described high temperature process, there has been developed a low temperature process adopting a processing temperature of about 600° C. or less. As one means for realizing a process of fabricating a thin film semiconductor device by the low temperature process, laser annealing using a laser beam has been examined. The laser annealing process involves forming a non-single crystal semiconductor thin film such as an amorphous or a polycrystalline silicon thin film on a low heat-resisting insulating substrate made from glass or the like, irradiating a laser beam to the semiconductor thin film to locally heat and fuse it, and crystallizing the semiconductor thin film at the cooling step. The semiconductor thin film thus crystallized is used as an active layer (channel region) of each of polycrystalline silicon thin film transistors which are integrally formed on the substrate. Since the crystallized semiconductor thin film exhibits a high carrier mobility as described above, it is possible to integrally form high performance thin film transistors by processing the crystallized semiconductor thin film.

In a liquid crystal display of a type containing a peripheral circuit (monolithic type) using an insulating substrate made from glass or the like, a polycrystalline silicon thin film transistor is required to have a good transistor characteristic, for example, a uniform and high drive current, for displaying a uniform image. That is, the silicon thin film must be reformed to exhibit a high carrier mobility. To be more specific, the performance of a thin film transistor must be improved by, as described above, crystallizing an amorphous silicon thin film. In this case, at present, to crystallize an amorphous silicon thin film, it is expected to adopt laser annealing using an excimer laser light source. As a manner of irradiating excimer laser light, there is being extensively developed a technology in which an excimer laser pulse having a linear or rectangular shaped uniform energy density is subjected to multi-scan shot. In general, as a process of forming an amorphous silicon film, there has been adopted a chemical vapor deposition (CVD) process, particularly, a PE (Plasma Enhanced) CVD process capable of depositing amorphous silicon on a glass sheet having a large area at a low temperature with a good throughput. In this CVD process, since a hydride is used as a source gas, hydrogen is contained in a silicon thin film in a large amount which reaches about 10 to 20 at %. Accordingly, if the amorphous silicon thin film containing a large amount of hydrogen is directly crystallized by laser annealing, hydrogen in the film tends to be aggregated to cause voids, which is inconvenient for fabrication of the thin film semiconductor device. For this reason, in general, before laser annealing for crystallization, the amorphous silicon film containing a large amount of hydrogen is subjected to a preliminary annealing in a heating furnace for removal of hydrogen from the film (dehydrogenation). However, even after such a pre-treatment, hydrogen remains in the film in an amount of about several at %, as a result of which there occur fine voids upon rapid heating by laser annealing, tending to locally deteriorate the silicon thin film. Also, in the PECVD process, $PH_3$ or $B_2H_6$ in a vapor-phase is occasionally mixed for introducing an impurity in a silicon thin film; however, due to adhesion of such a material on a tube wall of a film formation chamber and/or a limitation of controllability of mass flow, it is generally difficult to introduce an impurity in the entire silicon thin film at a relatively low concentration at a high uniformity and a good repeatability.

SUMMARY OF THE INVENTION

An object of the present invention is to provide a method of fabricating a thin film semiconductor device, in which a process of forming a silicon thin film used as an active layer of a thin film transistor is improved for enhancing a quality and a productivity of the silicon thin film.

To achieve the above object, according to the present invention, a thin film semiconductor device is fabricated in the following steps. First at a physical vapor deposition (PVD) step, an amorphous silicon thin film is physically formed on a substrate in vacuum. Then, at a laser annealing step, directly after formation of the amorphous silicon thin film without the need of dehydrogenation, a laser light is irradiated to the amorphous silicon thin film, to convert the amorphous silicon thin film into a polycrystalline silicon thin film. Next, at the processing step, the polycrystalline silicon thin film thus converted is processed to form a thin film transistor. In the physical vapor deposition step, an amorphous silicon thin film is preferably formed by sputtering using a target made from a silicon crystal body or a silicon sintered body. In the sputtering, an amorphous silicon thin film is preferably formed by sputtering using a target previously mixed with an impurity in a desired concentration. By introducing an impurity in the amorphous silicon thin film at the film formation stage, a threshold characteristic of a thin film transistor can be previously controlled.

The present invention includes a method of fabricating a display. The display is fabricated, in accordance with the present invention, in the following steps. First, an amorphous silicon thin film is physically formed on a first insulating substrate in vacuum. Directly after formation of the amorphous silicon thin film without the need of dehydrogenation, laser light is irradiated to the amorphous silicon thin film, to thereby convert the amorphous silicon thin film into a polycrystalline silicon thin film. Then, the polycrystalline silicon thin film thus converted is processed, to integrally form thin film transistors. Next, pixel electrodes are formed in a matrix in such a manner as to be connected to the individual thin film transistors, and then a second insulating substrate previously formed with a counter electrode to the first insulating substrate with a specific gap put therebetween. Finally, an electro-optic material is disposed in the gap, to complete the display.

According to the present invention, a silicon thin film being high in purity and small in hydrogen concentration can be obtained by sputtering a target in a high vacuum. Accordingly, the silicon thin film is continuously subjected to laser annealing without the need of dehydrogenation, to thereby shorten the fabrication process. Further, by use of a target made from a silicon crystal body or a silicon sintered body which is previously mixed with an impurity at a desired concentration, it is possible to accurately control the Fermi level in a polycrystalline silicon thin film obtained by the continuously performed subsequent crystallization using laser annealing. This makes it possible to obtain a thin film transistor having a stable threshold characteristic and hence to fabricate a high performance display panel on a glass sheet having a large area. To be more specific, according to the present invention, an amorphous silicon thin film with less hydrogen is formed not by the related art CVD process but by the PVD process, and the amorphous silicon thin film is continuously subjected to laser annealing to be converted into a polycrystalline silicon thin film. As a result, it is possible to form high quality silicon thin films each being homogeneous and with less voids (fine holes) at a good throughput. The technology using PVD (for example, sputtering) followed by laser annealing allows thin film transistors each having a stable performance to be integrally formed on a substrate, and therefore, such a technology can be applied to fabrication of a high performance liquid crystal display panel. The present invention is also applied, in addition to a liquid crystal panel, to fabrication of a SRAM adopting a stack TFT structure, to formation of various gates such as a floating gate of a nonvolatile memory, and to formation of a reflection preventive film and a silicon thin film for silicide.

DETAILED DESCRIPTION OF PREFERRED EMBODIMENT

Hereinafter, a preferred embodiment of the present invention will be described with reference to the accompanying drawings.

Figure 1A:
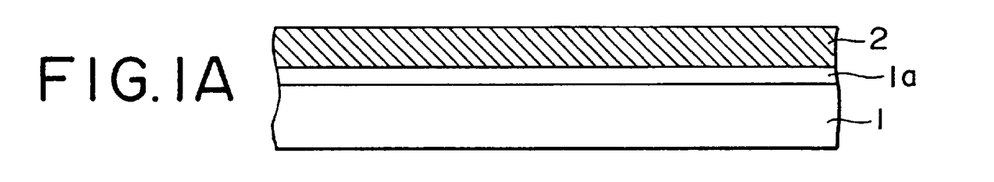
FIGS. 1A to 1D are views showing steps of fabricating a thin film semiconductor device according to the present invention.

FIGS. 1A to 1D are typical views showing a method of fabricating a thin film semiconductor device according to the present invention. First, as shown in FIG. 1A, $SiO_2$ and SiN films are formed on an insulating substrate 1 made from a glass sheet or the like having a large area, to form a passivation film 1a. The passivation film 1a is provided to prevent contamination due to impurities contained in the insulating substrate 1 made from glass or the like. An amorphous silicon thin film 2 is then deposited on the passivation film 1a to a thickness of about 50 nm by sputtering. In this sputtering, by use of a target mixed with a desired impurity, a threshold value of a thin film transistor can be controlled at a high accuracy without provision of any additional process. Then, the amorphous silicon thin film 2 is crystallized by laser annealing for improving the performance of the thin film 2. At this time, the amorphous silicon thin film 2 formed by sputtering contains, in principle, hydrogen in a small amount. Accordingly, without the need of dehydrogenation which has been performed in the related art method, the amorphous silicon thin film 2 is directly crystallized by irradiating pulses of a laser beam optically formed in a linear or rectangular shape to the amorphous silicon thin film 2. The irradiation of a laser beam is performed by a multi-scan shot or a batch shot. In the case of using a linear laser beam, a shape of an irradiation region is, for example, a rectangle of 150 mm×0.5 mm. By irradiating such a linear laser beam under the multi-scan short manner, laser annealing can be stably performed with a good throughput. At this time, a frequency of pulses of a laser beam is set at about 200 Hz. By performing laser annealing in such a manner, the amorphous silicon thin film 2, which contains less hydrogen, is stably and flatly converted into a polycrystalline silicon thin film, without occurrence voids or the like. In this way, according to this embodiment, the amorphous silicon thin film 2 is formed on the insulating substrate by sputtering, and is continuously subjected to laser annealing, to be thus converted into the polycrystalline silicon thin film. In this case, sputtering and laser annealing may be performed in the same chamber or may be in different chambers with the vacuum state being kept. Sputtering is performed at a high vacuum of, for example, $10^{-7}$ Torr or less. The interior of the film formation chamber is evacuated by a turbo-pump, and as atoms to be irradiated to the target, there may be used inert atoms of an element such as Ar, He, Ne or N. As the target, there may be used a silicon crystal body or a silicon sintered body previously mixed with an impurity such as B in a trace amount ($1\times10^{16}/cm^3$ or less).

Figure 1B:
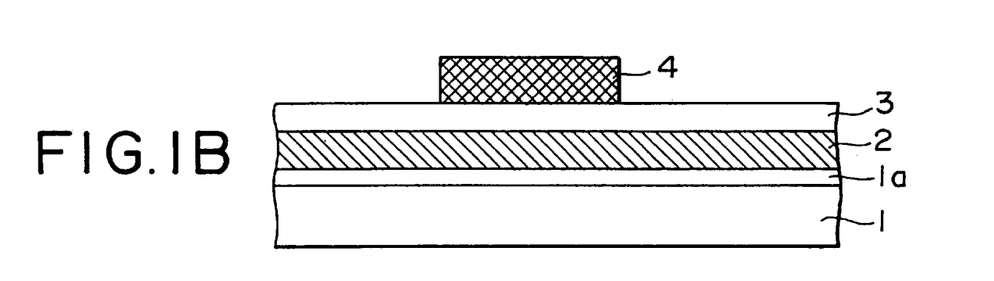
Figure 1C:
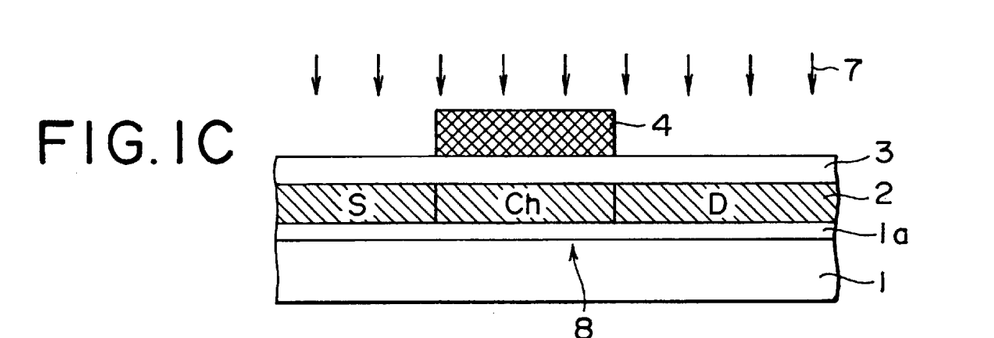
Figure 1D:
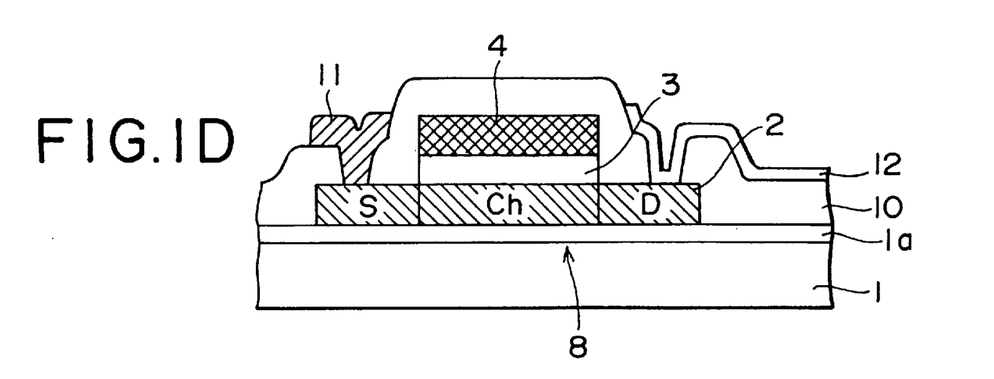

Then, as shown in FIG. 1B, a gate insulating film 3 made of silicon dioxide and a gate electrode 4 made from a metal are formed in this order on the crystallized silicon thin film 2, to form a basic structure of a top-gate type thin film transistor. Subsequently, as shown in FIGS. 1C, ions of an impurity 7 are doped in the silicon thin film 2 in self-alignment using the gate electrode 4 as a mask by ion implantation, to form a source region S and a drain region D of the thin film transistor 8. As a result, a channel region Ch not implanted with the impurity remains directly under the gate electrode 4. Finally, as shown in FIG. 1D, the gate insulating film 3 is cut in a size matched with that of the gate electrode 4, and the silicon thin film 2 is cut in a size matched with that of an element region of each thin film transistor 8. Then, the thin film transistor 8 is covered with an interlayer insulating film 10, and contact holes communicated with the source region S and the drain region D are opened in the interlayer insulating film 10 by etching. A signal wiring 11 and a pixel electrode 12 are patterned on the interlayer insulating film 10. Thus, a thin film semiconductor device for an active matrix type display panel is obtained.

Figure 2:
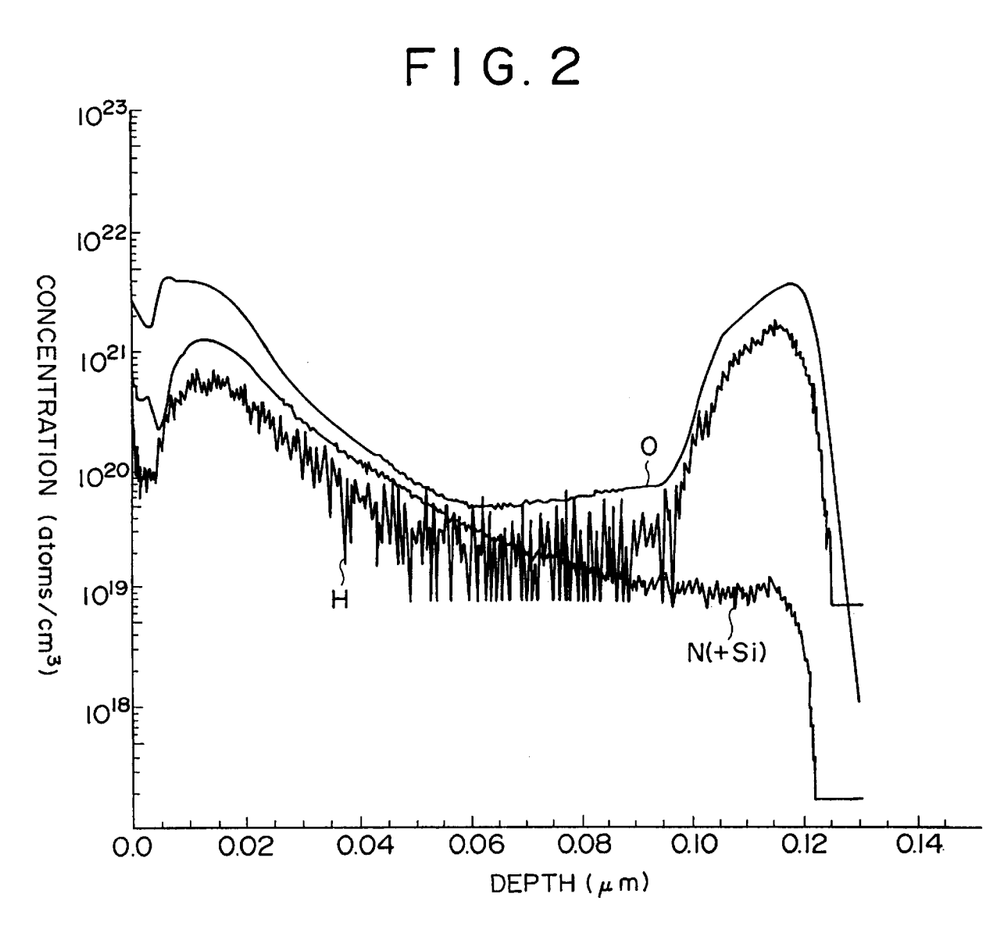
FIG. 2 is a graph showing a concentration of hydrogen contained in an amorphous silicon thin film formed by the method of the present invention.
Figure 3:
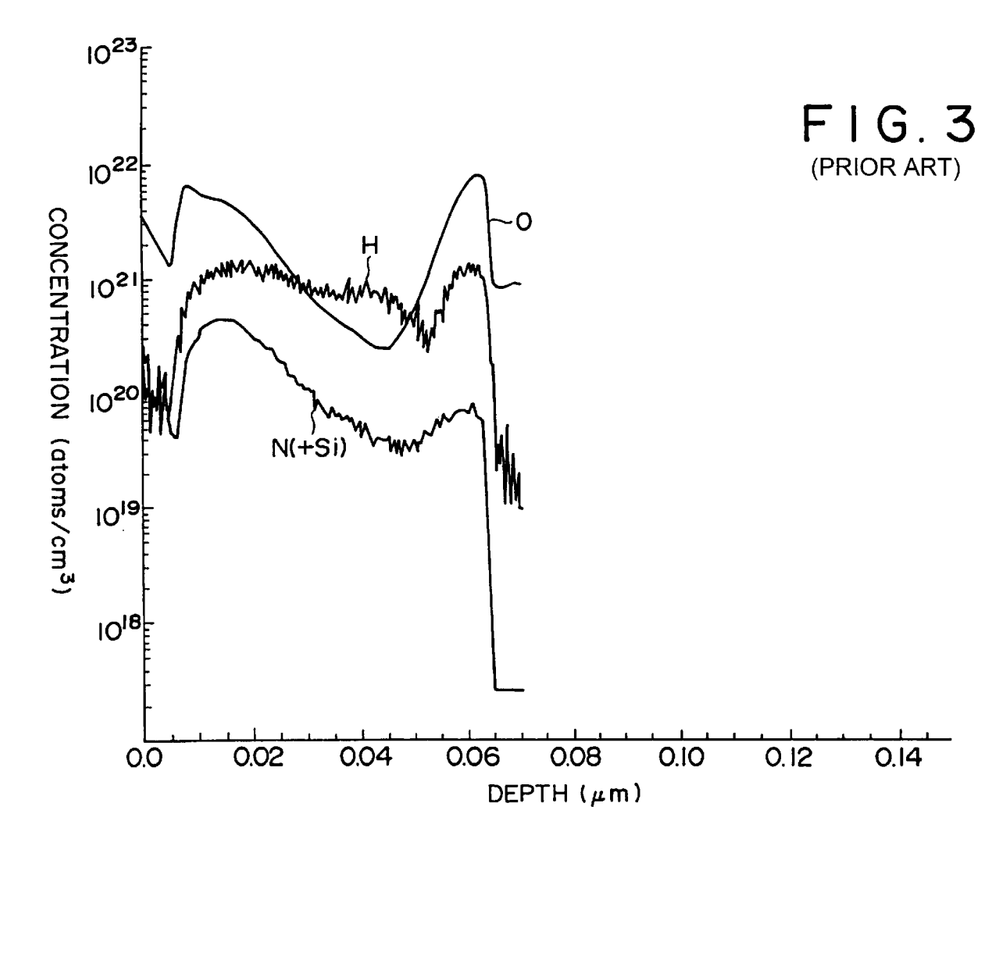
FIG. 3 is a graph showing a concentration of hydrogen contained in an amorphous silicon thin film formed by a related art method.

FIG. 2 is a graph showing a result of measuring a concentration of hydrogen contained in an amorphous silicon thin film formed by sputtering. In this figure, the abscissa indicates a concentration and the ordinate indicates a depth. The concentration data are obtained by counting secondary electrons emitted from the film. In addition to the hydrogen concentration, an oxygen concentration and a nitrogen concentration are shown in the graph. As is apparent from the graph, the hydrogen concentration in the silicon thin film formed by sputtering is about $1\times10^{20}/cm^3$. On the other hand, FIG. 3 shows a concentration of hydrogen contained in an amorphous silicon thin film formed by PECVD. In addition, data in the graph are measured for an amorphous silicon thin film which is formed at a substrate temperature of 260° C. by PECVD, followed annealing for dehydrogenation in a nitrogen atmosphere at 400° C. for 2 hr. As is apparent from the graph, the hydrogen concentration in the film is about $1\times10^{21}/cm^3$. Accordingly, as compared with the silicon thin film formed by PVD using sputtering, the silicon thin film formed by CVD contains hydrogen in an amount being about 10 times or more. In addition, the hydrogen concentration in the film before dehydrogenation is about $5\times10^{21}/cm^3$.

In this way, PVD (physical vapor deposition) has various advantages as compared with CVD (chemical vapor deposition). To be more specific, in the sputtering process, a silicon thin film can be formed at a low temperature of about 200° C., and further, a silicon thin film with a high purity can be formed by evacuating the interior of the film formation chamber into a high vacuum of about $10^{-6}$ to $10^{-7}$ Torr using a turbo-pump. Also, when needed, the concentration of an impurity in a silicon thin film can be controlled at a high accuracy by use of a target mixed with a desired impurity (P, B). Further, in the case of forming a silicon dioxide thin film on a silicon thin film, the silicon dioxide thin film can be continuously formed with the vacuum being kept, to thereby realize a multi-chamber system called "a cluster tool". And, the most important advantage lies in the fact that the hydrogen concentration in a silicon thin film formed by PVD such as sputtering is lower one digit or more than that in a silicon thin film formed by PE-CVD. Consequently, an amorphous silicon thin film formed by PVD such as sputtering can be continuously subjected to laser annealing without the need of hydrogenation.

Figure 4:
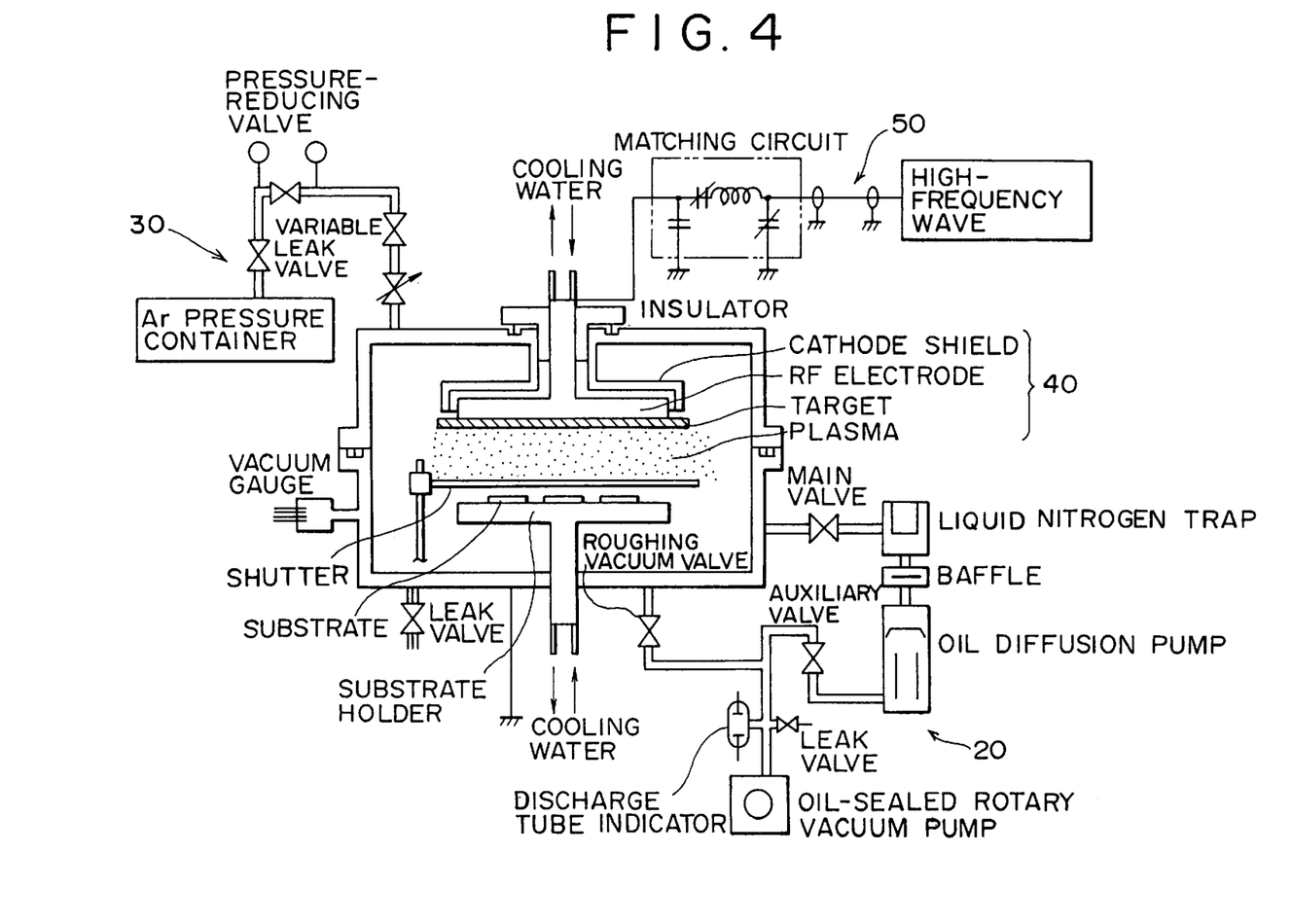
FIG. 4 is a typical diagram showing an outline of a sputtering system used for carrying out the present invention.

FIG. 4 shows, for reference, a sputtering system for carrying out the present invention. As shown in the figure, the sputtering system basically includes an exhaust system 20, a gas introducing system 30, an electrode system 40, and a sputtering power source 50. The electrode system 40 is mounted in a film formation chamber, and in the chamber, a substrate to be processed is mounted on a substrate holder. Over the substrate is disposed the electrode system 40 including a target, a RF electrode, and a cathode shield. The sputtering power source 50 is connected to the electrode system 40. The exhaust system 20 is provided for evacuate the interior of the film formation chamber into a high vacuum. The gas introducing system 30 is provided for introducing a source gas for sputtering into the film formation chamber.

With respect to the exhaust system 20, an oil diffusion pump cannot be used if a problem may arise with occurrence of even a slight amount of oil vapor. In the case where a back pressure less than $10^{-7}$ Torr and a high productivity are needed, a cryopump is used. With respect to the gas introducing system 30, a variable leak valve is used for introduction of Ar gas and adjustment of a flow rate of the Ar gas. For simplification of a valve structure, a needle type valve is used. For control of a flow rate at a high accuracy, an AFC (Automatic Flow Rate Controller) is used. With respect to the electrode system 40, the electrode excluding the target is covered with the cathode shield having an earth potential with a specific distance put therebetween. The shield prevents generation of discharge at the cathode excluding a target surface. It is desired to set shorter a distance between the shield and the electrode. The distance, however, should be determined in consideration of such a safety as not to allow short-circuit due to contaminant entrapped in the space therebetween. With respect to the sputtering power source 50, there is used a power source of an output impedance of 50Ω at a frequency of 13.56 MHz which is the industrial band specified under the Wireless Telegraphy Act.

For impedance matching between the RF power source and a load, a matching circuit is provided between the cathode and the power source. The adjustment is performed based on observation of both a travelling wave and a reflected wave through a transmission type power meter inserted in an output portion of the RF power source, to suppress the reflected wave at minimum.

Figure 5A:
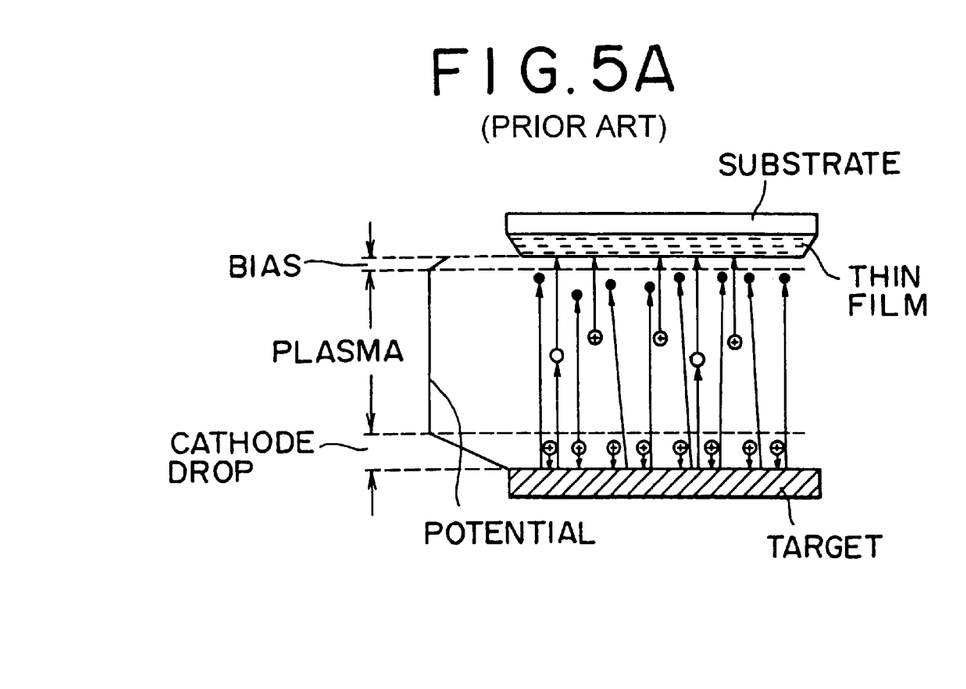
FIGS. 5A and 5B are views illustrating principles of sputtering and vacuum vapor-deposition, respectively, for comparison.
Figure 5B:
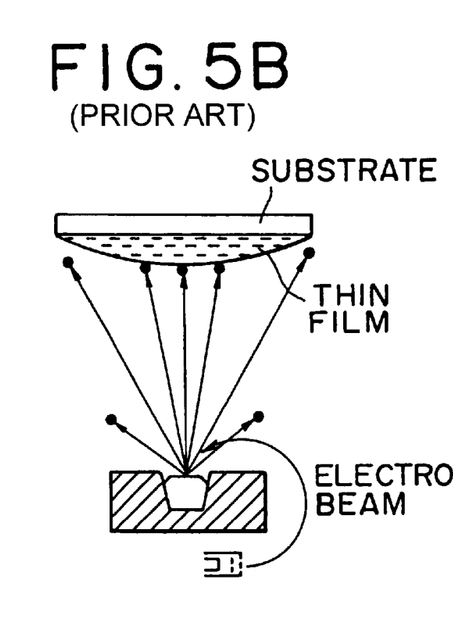

In the above description, PVD (physical vapor deposition) is represented by sputtering; however, it also includes vacuum vapor-deposition. FIGS. 5A and 5B are typical views showing principles of sputtering and electron beam vapor-deposition, respectively, for comparison. In these figures, particles shown by marks (●) indicate sputtered and vapor-deposited atoms; particles shown by marks (○) indicate high energy neutral atoms; and particles shown by marks (○ inserted with +) indicate ions. In general, a source for generating particles forming a thin film is called "a source", and a sheet or film on which a thin film grows is called "a substrate". In the sputtering process, ions in a plasma are accelerated in a region of a cathode drop, and then bombard a target to cause sputtering. That is, in sputtering, the source is planar to the target. The cathode drop is generally about 400 V, and atoms derived from the target by bombardment of ions having an energy close to the value (400 V) have about 10 eV. These atoms adhere on the substrate to form a thin film. In this case, as shown in the figure, the thin film grows while being irradiated with ions and high energy neutral atoms. Besides, in vacuum vapor-deposition, atoms are generally derived from the target by evaporation due to heating by irradiation of an electron beam. Accordingly, as shown in the figure, the source is equivalent to the size of a restricted electron beam, and thereby, it is point-shaped. The evaporated atoms have only a thermal energy which is about 0.2 eV depending on the kind of the atoms. Further, in vapor-deposition, growth of the thin film is not affected by bombardment of other high energy particles. The features of sputtering in consideration of the above difference in principle from electron beam vapor-deposition are as follows: A thin film having a good quality, for example, a high density thin film, a thin film having a crystal structure different from a bulk, or a thin film being large in adhesive strength to the substrate is obtained by suitably controlling the amount and the energy of high energy particles irradiated on a substrate during film formation. Also, in the case of forming an alloy thin film, it is difficult to obtain a thin film having a specific ratio of alloy contents by vapor-deposition because of a difference in vapor pressure between the alloy contents; however, in sputtering, by use of a target having a desired composition ratio, atoms of alloy elements are sequentially emitted from the surface of the target, so that there can be obtained a thin film having a nearly equal composition. Further, in sputtering, a growing rate of the film is stable because it is substantially proportional to a sputtering power, and accordingly, a thin film having a highly specified thickness can be obtained only by control of a processing time. On the other hand, a thickness distribution of a film obtained by vapor-deposition is based on a cosine rule from a point source, so that adjustment is required for making uniform the film thickness; however, in sputtering, a film is grown opposite to a planar source, it is possible to easily obtain a uniform film. Additionally, in sputtering, a service life of a target is relatively longer, so that sputtering is suitable for continuous operation. In this way, according to the present invention, either sputtering or vacuum vapor-deposition is used as PVD for forming a silicon thin film; however, it is desired to adopt sputtering in terms of film quality and productivity.

Figure 6:
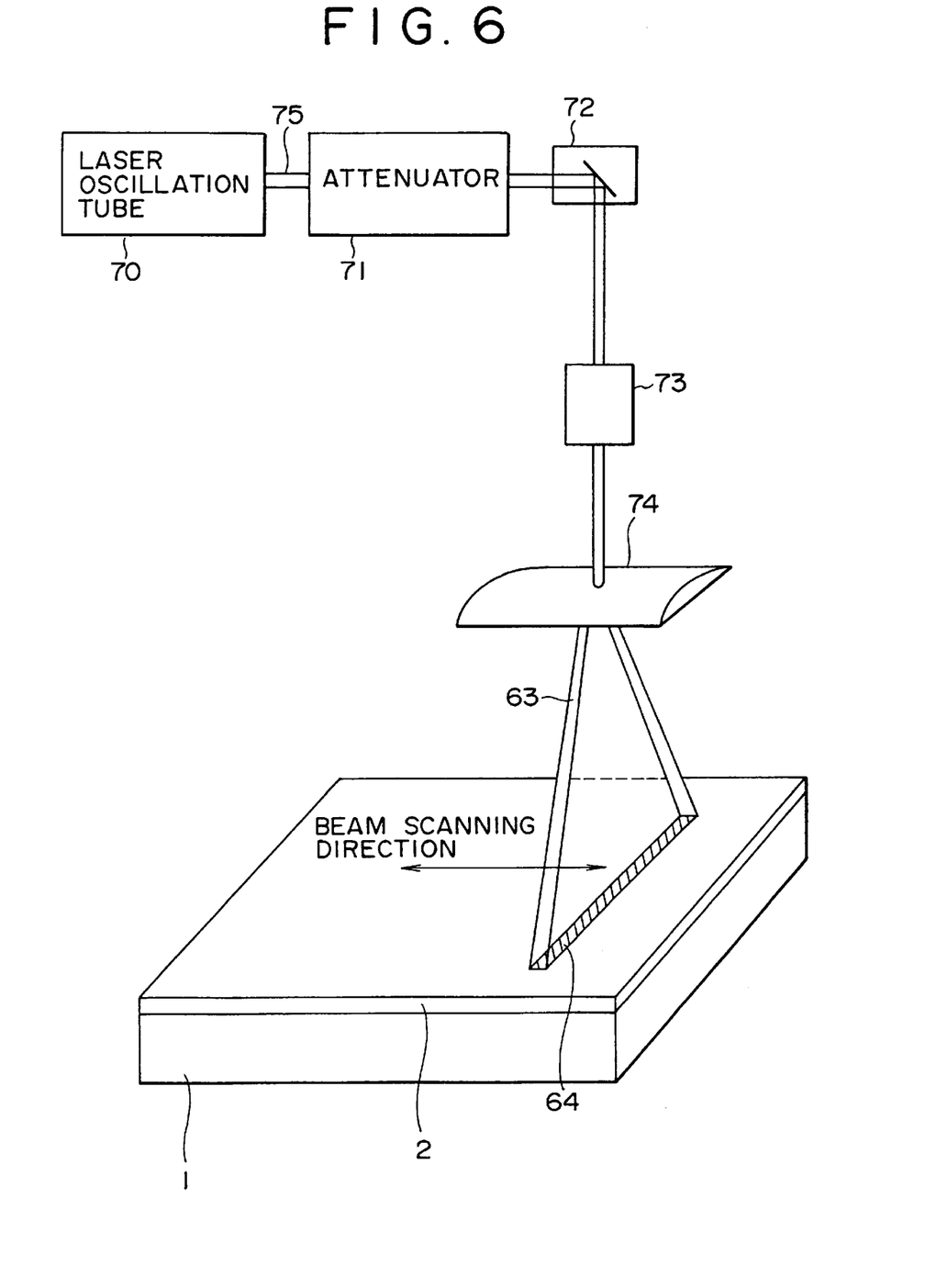
FIG. 6 is a typical diagram showing laser annealing performed in the method of fabricating a thin film semiconductor device according to the present invention.

FIG. 6 typically shows, for reference, a laser annealing step. First, prior to laser annealing, the amorphous silicon thin film 2 is formed on the insulating substrate 1 made from glass or the like by PVD such as sputtering. The amorphous silicon thin film 2 is then subjected to laser annealing using a laser beam (line beam) 63 having a specific beam shape in cross-section. However, the present invention is not limited to scanning using a line beam, and can be applied to scanning using a rectangular, square, or circular beam. Alternatively, the present invention is effective to one-shot irradiation performed for a large area of 20 mm×20 mm or larger. In this embodiment, scanning using the line beam 63 is adopted, and an irradiation area 64 extends in a longitudinal direction corresponding to the long-sized beam shape in cross-section. In this embodiment, the irradiation area 64 is one-dimensionally scanned in the direction perpendicular to the longitudinal direction, to crystallize the silicon thin film 2 having a specific area. Then, the silicon thin film 2 is processed to integrally form thin film transistors using the crystallized silicon thin film 2 as active layers thereof.

The line beam 63 is created by a line beam optical system shown in the figure and is one-dimensionally scanned. The line beam optical system includes a laser oscillation tube 70, attenuator 71, a mirror 72, a beam homogenizer 73, a cylindrical lens 74. The laser oscillation tube 70 is formed of an excimer laser unit for emitting pulses of a spot beam 75. The attenuator 71 is used to attenuate the spot beam 75 for adjusting an intensity of an irradiation energy. The spot beam 75 having passed through the attenuator 71 is reflected from the mirror 72 to enter in the beam homogenizer 73. The beam homogenizer 73 is an optical element for spacially equalizing a cross-sectional intensity distribution of the spot beam 75. The spot beam having passed through the beam homogenizer 73 is converted into the line beam 63 through the cylindrical lens 74. The mirror 72, beam homogenizer 73, and cylindrical lens 74 are integrally one-dimensionally scanned, so that the irradiation region 64 of the line beam 63 is steppedly scanned in the direction shown by an arrow. At this time, the irradiation region 64 is one-dimensionally scanned in a partially overlapped manner.

Figure 7:
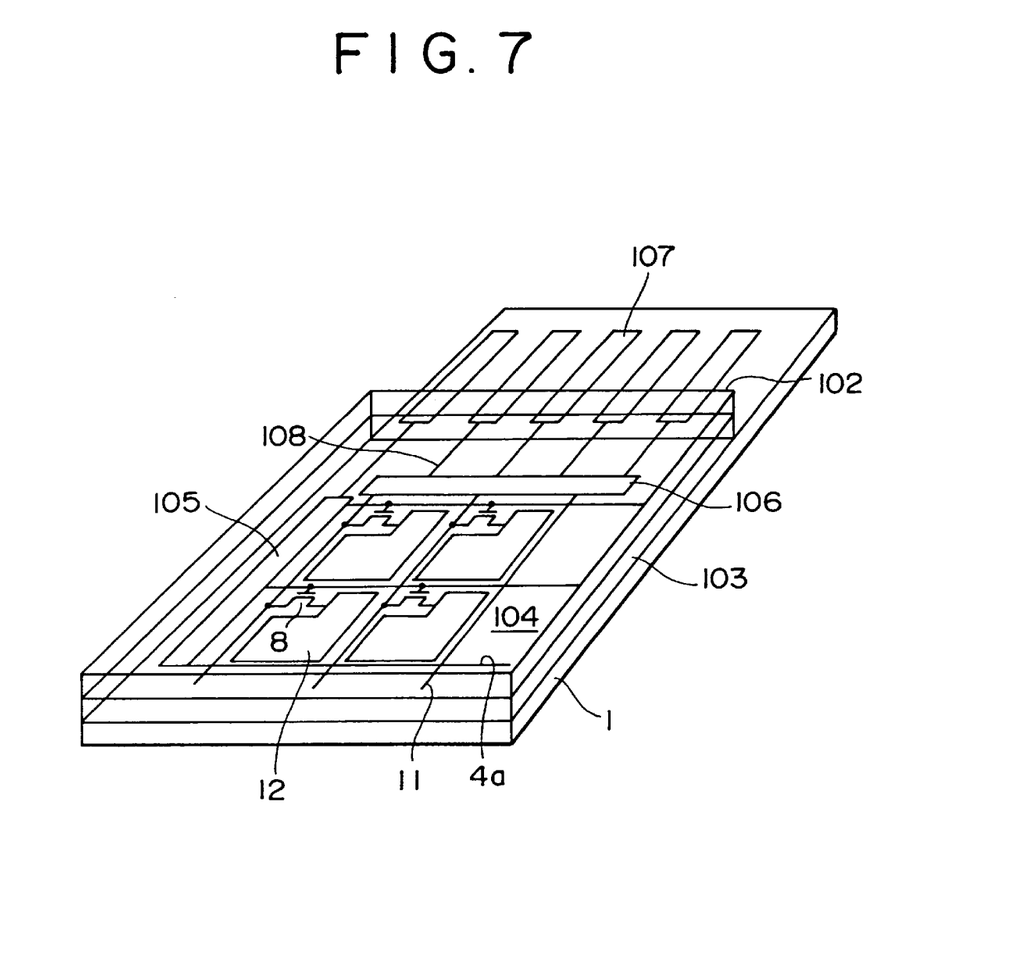
FIG. 7 is a typical diagram showing one application example of the thin film semiconductor device fabricated in accordance with the present invention.

FIG. 7 shows one example of an active matrix type display panel in which a thin film semiconductor device fabricated in accordance with the present invention is used as a drive substrate. The display panel includes an insulating substrate 1, another insulating substrate 102, and an electro-optical material 103 held therebetween. As the electro-optical material 103, a liquid crystal material or the like is widely used. As the lower side insulating substrate 1, there can be used a glass sheet allowed to have a large area and to be relative low in cost. The insulating substrate 1 has a monolithic structure in which a pixel array section 104 and a drive circuit section are integrally formed. That is, the insulating substrate 1 can integrally contain the peripheral drive circuit section in addition to the pixel array section 104. The drive circuit section is divided into a vertical scanning circuit 105 and a horizontal scanning circuit 106. Terminal portions 107 to be connected to external units are formed at an upper end of a peripheral portion of the insulating substrate 1. The terminal portions 107 are connected to the vertical scanning circuit 105 and the horizontal scanning circuit 106 through wirings 108. On the other hand, a counter electrode (not shown) is formed on the entire inner surface of the upper side insulating substrate 102. The pixel array section 104 has a row of gate wirings 4a and a column of signal wirings 11. The gate wirings 4a are connected to the vertical scanning circuit 105, and the signal wirings 11 are connected to the horizontal scanning circuit 106. Pixel electrodes 12 and thin film transistors 8 for driving the pixel electrodes 12 are integrally formed at crossing points between both the wirings 4a and 11. Thin film transistors are also integrally formed in the vertical scanning circuit 105 and the horizontal scanning circuit 106.

Figure 8:
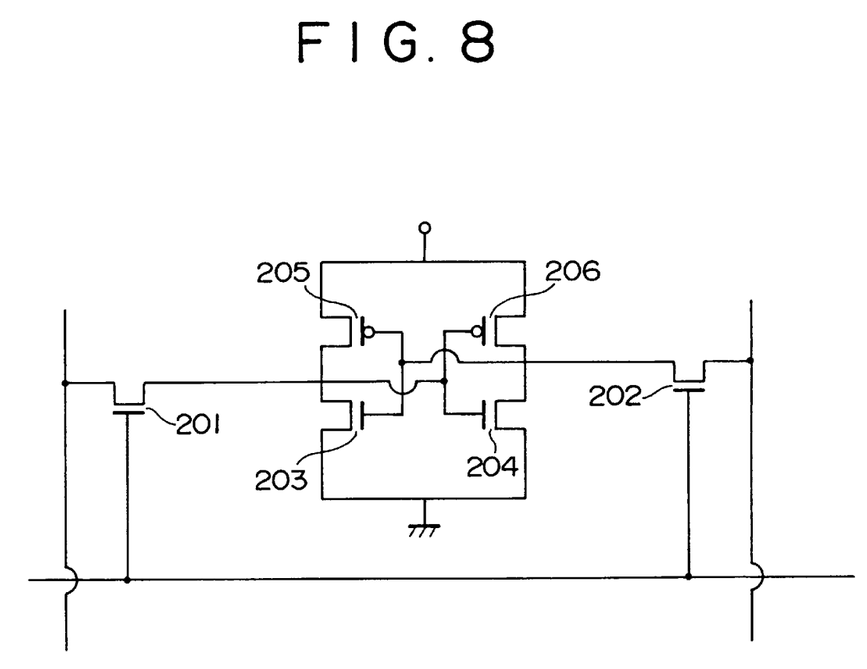
FIG. 8 is a typical circuit diagram showing another application example of the thin film semiconductor device fabricated in accordance with the present invention.

The present invention can be applied not only to fabrication of a thin film semiconductor device used for a display but also to fabrication of thin film semiconductor devices used for other applications. For example, FIG. 8 typically shows a SRAM fabricated in accordance with the present invention. A memory cell of the SRAM includes input and output transistors 201 and 202, and four transistors 203 to 206 constituting a flip-flop. Of six pieces of the transistors, the N-channel type transistors 201 to 204 are formed on a substrate formed of a bulk silicon wafer, and the two P-channel type transistors 205 and 206 are integrally formed as thin film transistors (TFTs) on a silicon wafer. In formation of the thin film transistors 205 and 206, a combination of sputtering and laser annealing in accordance with the present invention is used. That is, the present invention can be applied to a SRAM of a stack TFT type. Further, the present invention can be also applied to formation of various gates such as a floating gate of a nonvolatile memory, or formation of a reflection preventive film and a silicon thin film for silicide.

While the preferred embodiment of the present invention has been described using specific terms, such description is for illustrative purposes only, and it is to be understood that many changes and variations may be made without departing the spirit or scope of the following claims.

What is claimed is:

1. A method of fabricating a thin film semiconductor device, comprising:

a physical vapor deposition step of physically forming an amorphous silicon thin film on a substrate in a vacuum of $10^{-7}$ Torr or less wherein said amorphous silicon thin film contains no hydrogen;

a laser annealing step of irradiating laser light on the amorphous silicon thin film directly with the vacuum state maintained continuously after formation of the amorphous silicon thin film without the need of dehydrogenation, thereby converting the amorphous silicon thin film into a polycrystalline silicon thin film;

a step of forming a gate insulating film and a gate electrode;

a step of doping to form the source and drain using the gate as a mask;

a step of patterning the gate insulating film and the silicon thin film;

a step of covering with an insulating film;

a step of making contact holes in the insulating film over the source and drain; and a step of patterning signal wires on the insulating film.

2. A method of fabricating a thin film semiconductor device according to claim 1, wherein said physical vapor deposition step is a sputtering step of forming an amorphous silicon thin film by sputtering using a target made from a silicon crystal body or a silicon sintered body.

3. A method of fabricating a thin film semiconductor device according to claim 2, wherein said sputtering step is a step of forming an amorphous silicon thin film by sputtering using a target previously mixed with an impurity in a desired concentration, to introduce an impurity in the amorphous silicon thin film at the film formation stage, thereby previously controlling a threshold characteristic of a thin film transistor to be formed from a polycrystalline silicon thin film converted from the amorphous silicon thin film.

4. A method of fabricating a display, comprising:

a step of physically forming an amorphous silicon thin film on a first insulating substrate in vacuum of $10^{-7}$ Torr or less, wherein said amorphous silicon contains no hydrogen;

a step of irradiating laser light on the amorphous silicon thin film directly with the vacuum state maintained continuously after formation of the amorphous silicon thin film without the need of dehydrogenation, thereby converting the amorphous silicon thin film into a polycrystalline silicon thin film;

a step of processing the polycrystalline silicon thin film thus converted, to integrally form thin film transistors comprising:

a step of forming a gate insulating film and a gate electrode;

a step of doping to form the source and drain using the gate as a mask;

a step of patterning the gate insulating film and the silicon thin film;

a step of covering with an insulating film;

a step of making contact holes in the insulating film over the source and drain;

a step of patterning signal wires on the insulating film; and a step of forming pixel electrodes in a matrix in such a manner as to be connected to the individual thin film transistors;

a step of joining a second insulating substrate previously formed with a counter electrode to the first insulating substrate with a specific gap put therebetween; and a step of disposing an electro-optic material in the gap.

5. A method of fabricating a display according to claim 4, wherein said step of physically forming is a sputtering step of forming an amorphous silicon thin film by sputtering using a target made from a silicon crystal body or a silicon sintered body.

6. A method of fabricating a display according to claim 5, wherein said sputtering step is a step of forming an amorphous silicon thin film by sputtering using a target previously mixed with an impurity in a desired concentration to introduce an impurity in the amorphous silicon thin film at the film formation stage, thereby previously controlling a threshold characteristic of a thin film transistor to be formed from a polycrystalline silicon thin film converted from the amorphous silicon thin film.

* * * * *